(12) United States Patent
Nakamura (10) Patent No.: US 6,904,116 B2
(45) Date of Patent: Jun. 7, 2005

(54) SHIFT REGISTER

(75) Inventor: Mitsuyuki Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 135 days.

(21) Appl. No.: 10/358,198

(22) Filed: Feb. 5, 2003

(65) Prior Publication Data

US 2003/0147488 A1 Aug. 7, 2003

(30) Foreign Application Priority Data

Feb. 6, 2002 (JP) ........................................ 2002-029070

(51) Int. Cl.[7] .............................................. G11C 19/00
(52) U.S. Cl. ............................. 377/69; 377/78; 377/80; 377/81; 345/99; 345/100
(58) Field of Search ............................ 377/6.9, 7.8, 80, 377/81; 345/99, 100

(56) References Cited

U.S. PATENT DOCUMENTS 4,387,341 A * 6/1983 Martinson ..................... 341/50

FOREIGN PATENT DOCUMENTS

| EP | 1096506 A1 | 5/2001 |
|---|---|---|
| JP | S63-160408 A | 7/1988 |
| JP | H03-222539 A | 10/1991 |
| JP | 2001-126491 A | 5/2001 |
| WO | WO 98/56005 A2 | 12/1998 |

* cited by examiner

*Primary Examiner*—Margaret R. Wambach
(74) *Attorney, Agent, or Firm*—Sughrue Mion, PLLC (57) ABSTRACT

A shift register includes bidirectional register units, a direction switching section, a register unit selecting section, and a shift clock supply section. The bidirectional register units are cascaded through first input/output terminals for data shifting and perform data shifting operation. The bidirectional register units have second input/output terminals which separately and directly input/output data. The direction switching section switches the shifting directions of the bidirectional register units. The register unit selecting section selects one of the bidirectional register units and inputs/outputs data through the second input/output terminal. The shift clock supply section supplies shift clocks to the bidirectional register units ranging from the bidirectional register unit selected by the register unit selecting section to the last-stage bidirectional register unit.

8 Claims, 5 Drawing Sheets

FIG. 4A STEP 1

| RU1 | RU2 | RU3 | RU4 | RU5 | RU6 | RU7 | RU8 | RU9 | RU10 | RU11 | RU12 | RU13 | RU14 |
|---|---|---|---|---|---|---|---|---|---|---|---|---|---|
| A1 | A2 | A3 | A4 | B1 | B2 | B3 | C1 | C4 | D2 | D3 | | | |

FIG. 4B STEP 2

| A1 | A2 | A3 | A4 | B1 | B2 | B3 | [B4 INSERTION] ⇒ | C1 | C4 | D2 | D3 | | | |

FIG. 4C STEP 3

| A1 | A2 | A3 | A4 | B1 | B2 | B3 | B4 | C1 | C4 | D2 | D3 | | | | ← SHIFT

FIG. 4D STEP 4

| A1 | A2 | A3 ⇒ DELETION | A4 | B1 | B2 | B3 | B4 | C1 | C4 | D2 | D3 | | | |

FIG. 4E STEP 5

| A1 | A2 | A4 | B1 | B2 | B3 | B4 | C1 | C4 | D2 | D3 | | | | | ← SHIFT

SHIFT REGISTER

BACKGROUND OF THE INVENTION

The present invention relates to a shift register formed by cascading a plurality of bidirectional register units and, more particularly, to a shift register which can quickly perform processing such as inserting and deleting data with respect to a held data string.

In order to orderly organize data in a communication device or the like by rearranging the data in chronological order or address order, some operation is required for a data string. Conventionally, such a function has been implemented by software processing. For example, new data is generally inserted into a data string by a technique of using a program to shift data located behind the insertion location of the new data one by one and inserting the new data into the resultant free space. A large amount of time is therefore required to insert even one data.

In order to solve this problem, the present inventor has proposed a shift register in Japanese Patent Laid-Open No. 2001-126491 (reference 1), which performs data inserting operation (data construction) with respect to a data string very quickly and easily by using a relatively simple hardware arrangement as compared with conventional software processing.

Although the shift register disclosed in reference 1 can quickly and easily insert data into a data string, it requires a long processing time to delete specific data from a held data string. This is because, in order to delete specific data, data recorded on consecutive shift register units on the subsequent-stage of the shift register on which the data to be deleted is recorded must be sequentially read out, and the read data must be repeatedly written in the preceding-stage shift register units.

SUMMARY OF THE INVENTION

It is an object of the present invention to provide a shift register which can quickly and easily perform operation with respect to a data string like inserting data in the data string and deleting data from the data string by using a simple hardware arrangement.

In order to achieve the above object, according to the present invention, there is provided a shift register comprising a plurality of bidirectional register units which are cascaded through first input/output terminals for data shifting and perform data shifting operation, the bidirectional register units having second input/output terminals which separately and directly input/output data, direction switching means for switching shifting directions of the bidirectional register units, register unit selection means for selecting one of the bidirectional register units and inputting/outputting data through the second input/output terminal, and shift clock supply means for supplying shift clocks to the bidirectional register units ranging from a bidirectional register unit selected by the register unit selection means to a last-stage bidirectional register unit.

DESCRIPTION OF THE PREFERRED EMBODIMENTS

The present invention will be described in detail below with reference to the accompanying drawings.

Figure 1:
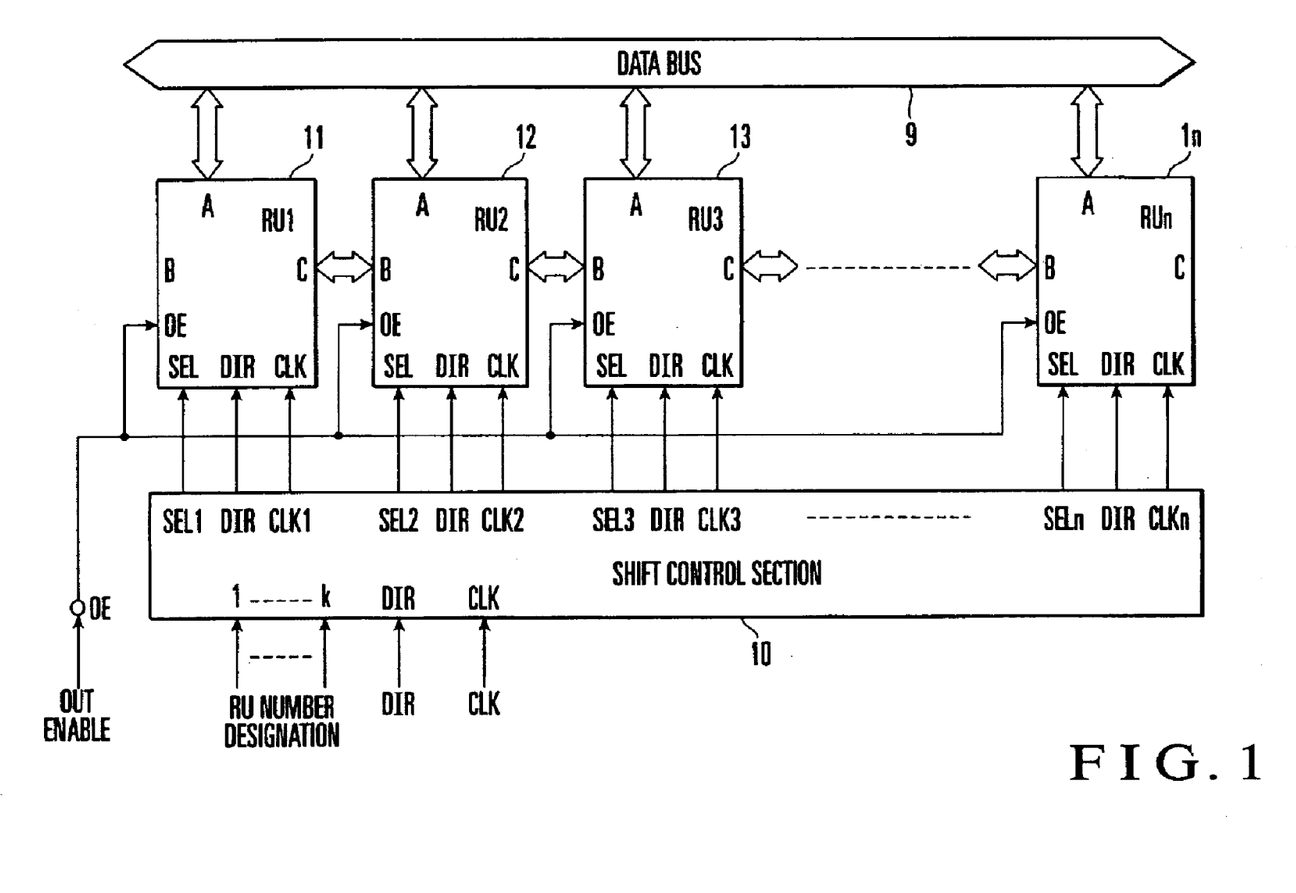
FIG. 1 is block diagram showing a shift register according to the first embodiment of the present invention.

FIG. 1 shows a shift register according to the first embodiment of the present invention. The shift register according to this embodiment is comprised of n (n is a natural number equal to or more than 2) cascaded bidirectional register units (RUs) 11 to 1n and a shift control section 10 for controlling the bidirectional register units 11 to 1n.

Each of the bidirectional register units 11 to 1n includes an m-bit (m is a natural number) input/output terminal (direct input/output terminal) A capable of parallelly inputting/outputting data from/to a data bus 9 having a m-bit bus width, an m-bit input/output terminal (preceding-stage shifting input/output terminal) B for parallelly inputting/outputting data to/from the preceding-stage bidirectional register unit, and an m-bit input/output terminal (subsequent-stage shifting input/output terminal) C for parallelly inputting/outputting data to/from the subsequent-stage bidirectional register unit. Each of the bidirectional register units 11 to 1n also includes a CLK signal terminal for inputting a CLK signal (shift clock), a DIR signal terminal for inputting a DIR signal for designating a shifting direction, an SEL signal terminal for inputting an SEL signal for designating a bidirectional register unit which directly inputs/outputs data to/from the data bus 9, and an OE signal terminal for inputting an OE signal for causing the register unit to output held data to the data bus 9, together with the SEL signal.

The shifting direction of each of the bidirectional register units 11 to 1n can be changed by the DIR signal. Assume that the shifting direction from left to right is the forward direction, and the shifting direction from right to left is the reverse direction.

A case wherein the DIR signal is set in the forward direction will be described first. When the DIR signal is set in the forward direction, each of the bidirectional register units 11 to 1n outputs held data from the input/output terminal C. In addition, the output data output from the input/output terminal C of the preceding-stage bidirectional register unit or data on the data bus 9 is selected as input data in accordance with the SEL signal. The input data is received in response to the CLK signal.

In this case, each of the bidirectional register units 11 to 1n selects the input/output terminal A or input/output terminal B as a terminal for receiving the input data in accordance with the SEL signal. The received input data is held until the next CLK signal is input. When the input/output terminal A has been selected in accordance with the SEL signal and the OE signal is input to the OE signal terminal, the held data is output to the data bus 9. Note that the OE signal is externally supplied as a common signal to the bidirectional register units 11 to 1n.

When the DIR signal is set in the reverse direction, each of the bidirectional register units 11 to 1n outputs held data from the input/output terminal B. Each bidirectional register unit receives the output data from the input/output terminal B of the subsequent-stage bidirectional register unit as input data in response to the CLK signal, and holds the data until the next CLK signal is input. When the input/output terminal A has been selected in accordance with the SEL signal and the OE signal is input to the OE signal terminal, the held data is output to the data bus 9.

The shift control section 10 has k-bit (k is a natural number) RU number designation terminals, a DIR signal input terminal, a CLK signal input terminal, and n sets of SEL signal output terminals, DIR signal output terminals, and CLK signal output terminals which exhibit one-to-one correspondence with the bidirectional register units 11 to 1n. The DIR input terminals and DIR output terminals constitute shifting direction switching means. When a binary signal of RU number designation data is input to the RU number designation terminals, the shift control section 10 outputs, to the bidirectional register unit designated by the RU number designation data, the SEL signal from the corresponding SEL signal output terminal.

In addition, the shift control section 10 outputs, to the bidirectional register units subsequent to the bidirectional register unit designated by the RU number designation data, the CLK signals as shift clocks, input from the CLK signal input terminal, from the corresponding CLK signal output terminals. The DIR signals input from the DIR signal input terminal are directly distributed from the DIR signal output terminals to the respective bidirectional register units 11 to 1n.

As described above, the shift control section 10 includes the bidirectional register unit selection means for selectively performing data input/output operation with respect to arbitrary bidirectional register units through the direct input/output terminals, the shift clock supply means for selectively supplying shift clocks to the cascaded bidirectional register units 11 to 1n ranging from the bidirectional register unit selected by the bidirectional register unit selection means to the last bidirectional register unit, and the input/output direction switching means for switching input/output directions of the respective bidirectional register units 11 to 1n.

Figure 2:
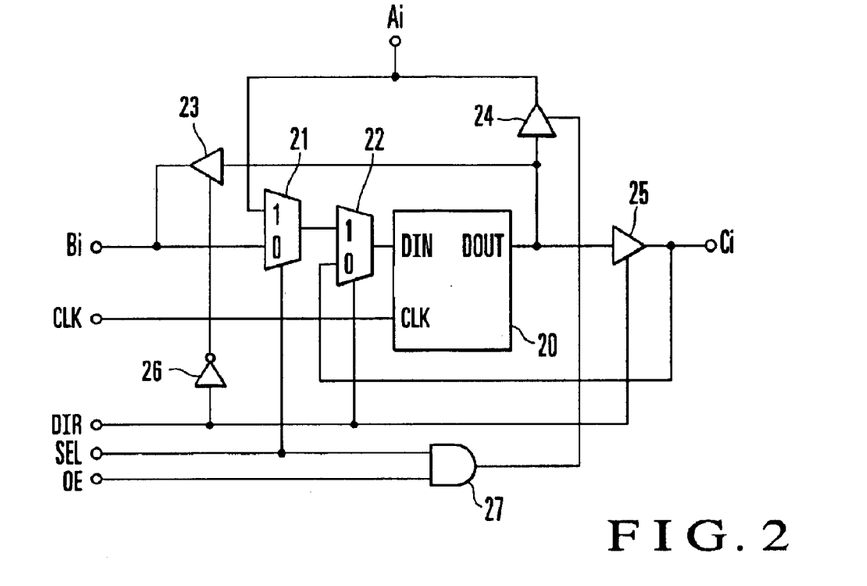
FIG. 2 is a circuit diagram showing a 1-bit arrangement of each bidirectional register unit in FIG. 1.

The detailed circuit arrangement of each component of the above bidirectional register units 11 to 1n will be described next. FIG. 2 shows a 1-bit arrangement of each bidirectional register unit. Such circuits are arranged in parallel by the bus width of the data bus to constitute each of the bidirectional register units 11 to 1n. The 1-bit circuit shown in FIG. 2 is comprised of a D-type flip-flop 20, selectors 21 and 22, enabled buffers 23, 24, and 25, a NOT circuit 26, and an AND circuit 27.

The D-type flip-flop 20 has a data input terminal DIN, data output terminal DOUT, and a CLK signal input terminal CLK. The data input terminal DIN is connected to the output terminal of the selector 22 which is used to switch input operations in the forward and reverse directions. The data output terminal DOUT is connected to the input of each of the enabled buffers 23, 24, and 25. The CLK signal input terminal CLK is connected to the CLK signal terminal of the bidirectional register unit.

Note that a latch or the like may be used in place of the D-type flip-flop 20. Although a reset or preset signal is generally connected to the D-type flip-flop, a description thereof will be omitted for the sake of simplicity.

Each of the selectors 21 and 22 has two input terminals "0" and "1", a selection signal input terminal, and an output terminal. In the selector 21, the input terminal "0" is connected to an input/output terminal Bi ($1 \leq i \leq m$) of the bidirectional register unit, the input terminal "1" is connected to an input/output terminal Ai ($1 \leq i \leq m$) of the bidirectional register unit, and the selection signal input terminal is connected to the SEL signal terminal of the bidirectional register unit. In the selector 22, the input terminal "0" is connected to an input/output terminal Ci ($1 \leq i \leq m$) of the bidirectional register unit, the input terminal "1" is connected to the output terminal of the bidirectional interface 21, the selection signal input terminal is connected to the DIR signal terminal of the bidirectional register unit, and the output terminal is connected to the data input terminal DIN of the D-type flip-flop 20.

Each of the enabled buffers 23, 24, and 25 has an input terminal, enable signal input terminal, and output terminal. In the enabled buffer 23, the input terminal is connected to the data output terminal DOUT of the D-type flip-flop 20 as described above, the output terminal is connected to the input/output terminal Bi ($1 \leq i \leq m$) of the bidirectional register unit, and the enable signal input terminal is connected to the output terminal of the NOT circuit 26. The input terminal of the NOT circuit 26 is connected to the DIR signal terminal of the bidirectional register unit.

In the enabled buffer 24, the input terminal is connected to the data output terminal DOUT of the D-type flip-flop 20 as described above, the output terminal is connected to the input/output terminal Ai ($1 \leq i \leq m$) of the bidirectional register unit, and the enable signal input terminal is connected to the output terminal of the AND circuit 27. The AND circuit 27 has two input terminals. One of these input terminals is connected to the SEL signal terminal of the bidirectional register unit, and the other input terminal is connected to the OE signal terminal.

In the enabled buffer 25, the input terminal is connected to the data output terminal DOUT of the D-type flip-flop 20 as described above, the output terminal is connected to the input/output terminal Ci ($1 \leq i \leq m$) of the bidirectional register unit, and the enable signal input terminal is connected to the DIR signal terminal of the bidirectional register unit.

The operation of each 1-bit circuit having the above arrangement will be described next. If the DIR signal is at "H" level, the bidirectional register unit performs operation in the forward direction. In this case, the input/output terminal Bi and input/output terminal Ci respectively serve as a data input port and data output port owing to the functions of the selector 22, enabled buffers 23 and 25, and NOT circuit 26. If the SEL signal is at "L" level, the selector 21 selects the input/output terminal Bi to which a signal from the preceding-stage bidirectional register unit is input. If the SEL signal is at "H" level, the selector 21 selects the input/output terminal Ai to which a signal from the data bus is input. In response to the CLK signal, the selected input data is received.

If the DIR signal is at "L" level, the input/output terminal Ci and input/output terminal Bi of the bidirectional register unit serve as a data input port and data output port, respectively, thereby performing reverse shifting operation. That is, the input data from the input/output terminal Ci is received in response to the CLK signal. In addition, if both the SEL signal and the OE signal are at "H" level, the AND circuit 27 is set at "H" level regardless of the direction of the DIR signal, and the enabled buffer 24 is rendered conductive, thereby outputting data from the D-type flip-flop 20 onto the data bus.

Figure 3:
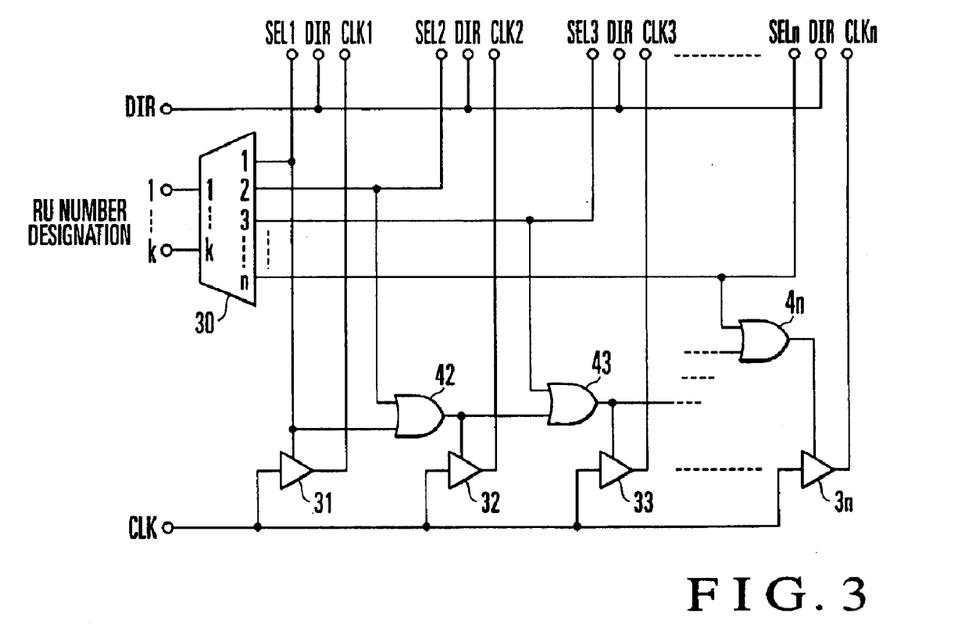
FIG. 3 is a circuit diagram showing a shift control section in FIG. 1.

FIG. 3 shows the detailed arrangement of the shift control section 10. The circuit shown in FIG. 3 is comprised of a line decoder 30, n enabled buffers 31 to 3n, and (n−1) OR circuits 42 to 4n. The line decoder (register unit selection means) 30 has RU number designation signal input terminals 1 to k connected to k-bit (k is a natural number) RU number designation terminals of the shift control section 10 in one-to-one correspondence, and n output terminals 1 to n for outputting input signal decoding results.

Each of the enabled buffers (shift clock supply means) 31 to 3n has an input terminal, enable signal input terminal, and output terminal. Each of the OR circuits 42 to 4n has two input terminals and an output terminal.

The n output terminals 1 to n of the line decoder 30 are connected to the n SEL signal outputs of the shift control section in one-to-once correspondence. The output terminal 1 is connected to the enable signal input terminal of the first-stage enabled buffer 31 and one input terminal of the second-stage OR circuit 42. The output terminal 2 of the line decoder 30 is connected to the other input terminal of the OR circuit 42. The output terminal of the OR circuit 42 is connected to the enable signal input terminal of the second-stage enabled buffer 32 and one input terminal of the third-stage OR circuit 43.

Likewise, the output terminals of the OR circuits 43 to 4n are connected to the enable signal input terminals of the enabled buffers 33 to 3n on the same stages, and the output terminal of each of the OR circuits 43 to 4(n-1) is connected to one input terminal of the subsequent-stage OR circuit. Each of the output terminals 3 to n of the line decoder 30 is connected to the other input terminal of a corresponding one of the OR circuits 43 to 4n. In addition, the DIR signal input terminal of the shift control section is connected to the n DIR signal output terminals of the shift control section.

The operation of the circuit shown in FIG. 3 will be described next. When RU number designation signals 1 to k are input to the line decoder 30, an output from an output terminal, of the output terminals 1 to n, which corresponds to the number designated by the RU number designation signals, and the SEL signal output are set at "H" level as decoding results. In addition, outputs from OR circuits, of the OR circuits 42 to 4n, which follow the OR circuit to which the "H"-level SEL signal is input are sequentially set at "H" level. As a consequence, enabled buffers following the enabled buffer corresponding to the number designated by the RU number designation signals are rendered conductive, and the CLK signals are transferred to CLK signal output terminals following the terminal corresponding to the designated number.

In this embodiment, the DIR signal is transferred to all the DIR signal output terminals without any special processing. However, the embodiment may additionally have a circuit for performing control to change the polarities of only DIR signals following a DIR signal corresponding to the number designated by the SEL signal as in the case of the CLK signal.

The operation of the shift register shown in FIG. 1 will be described next with reference to FIGS. 4A to 4E. Assume that there are four types of data, i.e., data A, B, C, and D. Each type includes a plurality of data, and numbers are assigned to the respective data. Consider a case wherein sequentially generated data must be arranged in the order of A to D, and data of the same type must be arranged in increasing number order. Step 1 (FIG. 4A) indicates a data string stored in the bidirectional registers RU1 to RU14 at a given time point. Assume that data A1, A2, A3, A4, B1, B2, B3, C1, C4, D2, and D3 are respectively recorded on the bidirectional registers RU1 to RU11, but no data is recorded on the bidirectional registers RU12 to RU14.

As indicated by step 2 (FIG. 4B), when data B4 is generated, the data B4 should be inserted between the data B3 and the data C1. In this case, in order to cause the shift register shown in FIG. 1 to perform inserting operation, the data B4 is output onto the data bus first. Then, RU number designation data indicating the eighth-stage bidirectional register unit RU8 in which the data C1 is stored is input to the RU number designation terminals of the shift control section 10. The DIR signal set in the forward direction is input to the DIR signal input terminal. The CLK signal as a shift clock is applied to the CLK signal input terminal of the shift control section 10. Step 3 (FIG. 4C) indicates the result of the above inserting operation.

According to this embodiment, data can be easily and quickly inserted at an arbitrary position to construct a data string with a desired arrangement.

Figure 4A:
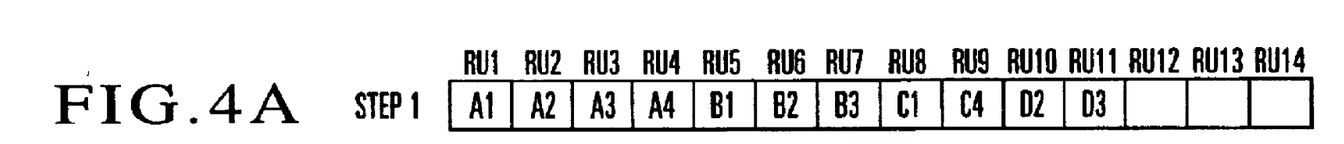
FIGS. 4A to 4E are views for explaining the operation of the shift register in FIG. 1.
Figure 4B:
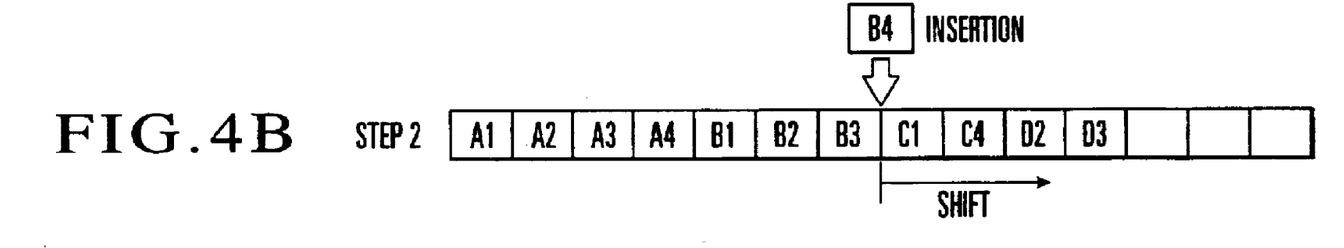
Figure 4C:
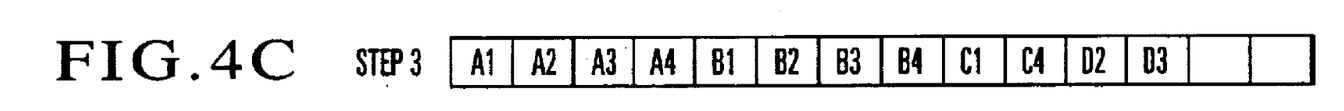
Figure 4D:
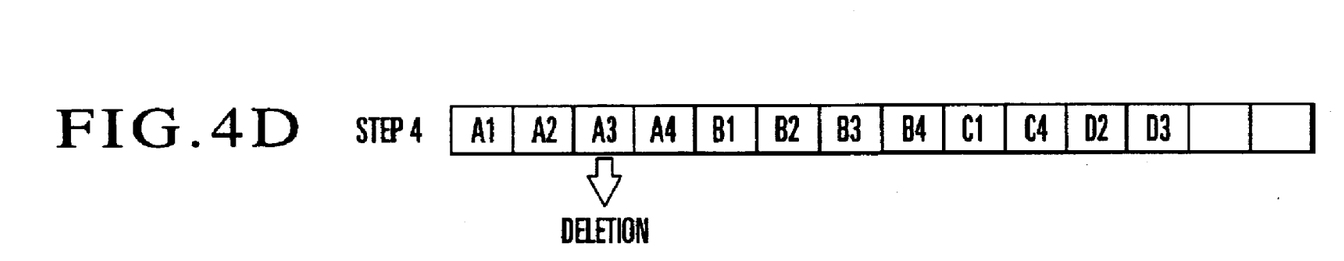
Figure 4E:
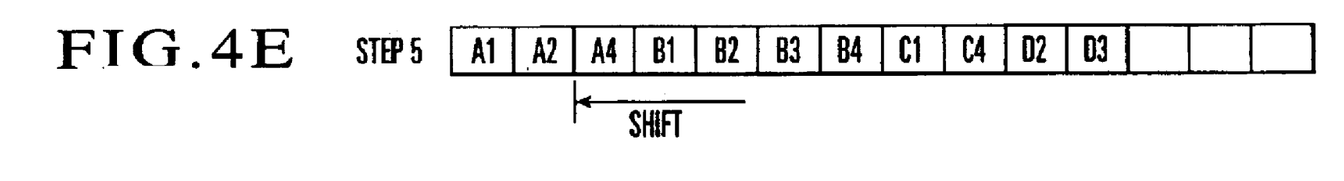

A case wherein specific data is deleted, and the resultant free space is then filled with the data following the deleted data will be described next. Consider a case wherein the data A3 is deleted, and the resultant free space is to be filled by shifting the data following the data A3 to the left as indicated by step 4 (FIG. 4D). First of all, RU number designation data indicating the third-stage bidirectional register unit RU3 in which the data A3 is stored is input to the RU number designation terminals of the shift control section 10. The DIR signal to be input to the DIR signal input terminal is then set in the reverse direction. The CLK signal as a shift clock is applied to the CLK signal input terminal of the shift control section 10. As a consequence, the data A3 is deleted (overwritten), and the data A4 to D3 are shifted to the left by one stage.

Note that a proper value like "0" is input to the rightmost bidirectional register unit. Step 5 (FIG. 4E) indicates the result of the above deleting operation. According to this embodiment, deletion of data at an arbitrary position and filling operation can be easily and quickly done to construct a data string with a desired arrangement.

Outputting of specific data to the data bus 9 will be described next. When data is to be read out, RU number designation data indicating the bidirectional register unit in which the data to be read out is stored may be input to the RU number designation terminals of the shift control section 10, together with the OE signal. With this operation, the data held in the designated bidirectional register unit is output to the data bus 9. This makes it possible to externally read out the data.

Figure 5:
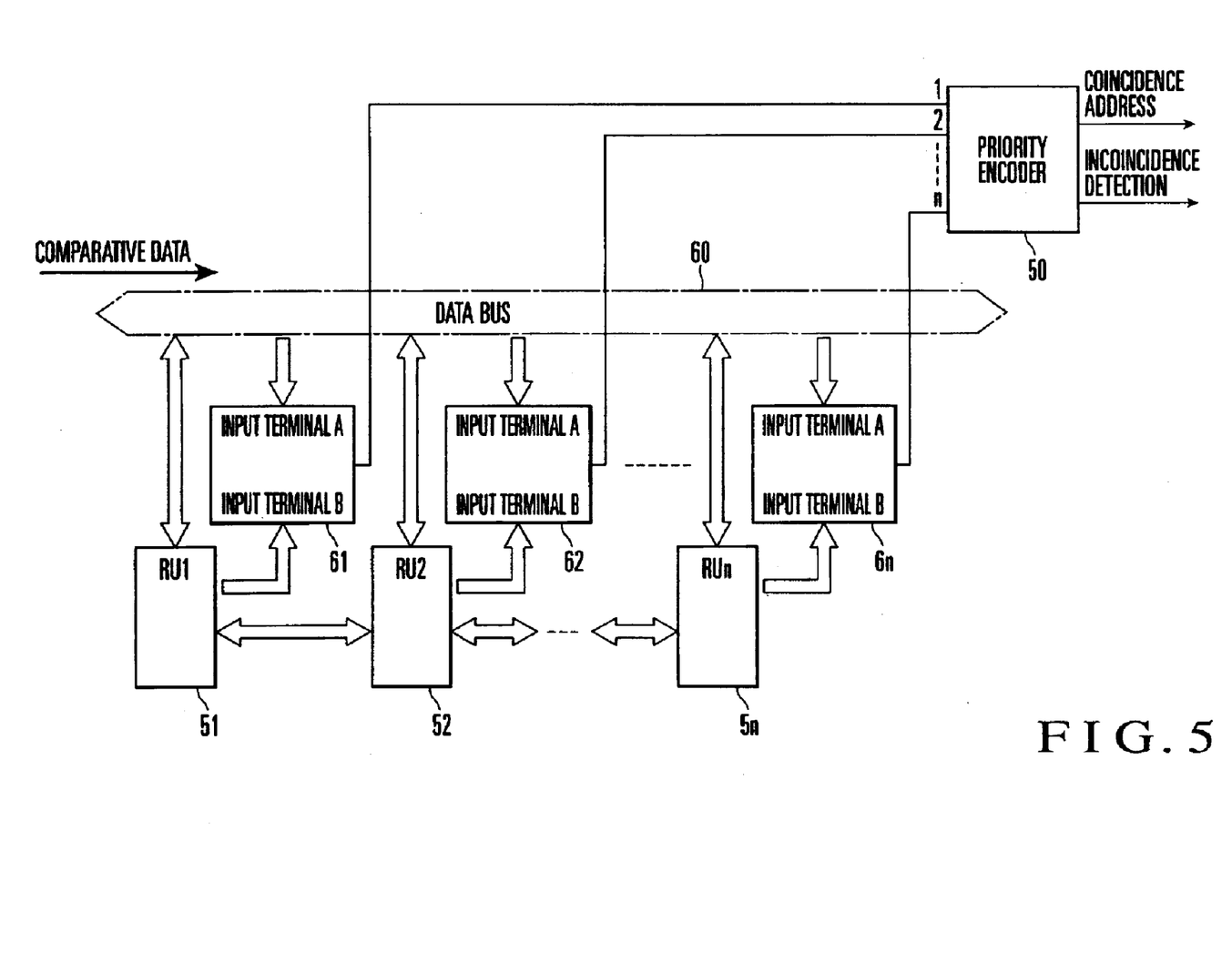
FIG. 5 is a block diagram showing a shift register according to the second embodiment of the present invention.

FIG. 5 shows a shift register according to the second embodiment of the present invention. In the first embodiment, as described with reference to FIGS. 4A to 4E, the position of the data B3 must be detected to insert the data B4, and the position of the data A3 must be detected to delete the data A3. As a method of detecting such positions, the first method is available, which searches for data one by one from the start. The second method using dichotomy is also available, which is executed as follows. If the arrangement of data exhibits regularity, an intermediate value is found, and it is checked whether the target value is located before or after the intermediate value. In the remaining half group, the location of the target value is determined from an intermediate value in the same manner, thereby narrowing the search. In either of the methods, a considerably large number of steps are required on average until the target value is detected.

In this embodiment, as shown in FIG. 5, an address output means constituted by n comparators 61 to 6n and a priority encoder 50 is added to the arrangement in FIG. 1. FIG. 5 shows elements added to the shift register described with reference to FIG. 1. An illustration of a shift control section 10 is omitted. Referring to FIG. 5, bidirectional register units 51 to 5n as RU1 to RUn are identical to the bidirectional register units 11 to 1n FIG. 1. Input terminals A of the comparators 61 to 6n are connected to a data bus 60, and input terminals B are connected to the output terminals of the flip-flops (or latches) of the bidirectional register units 51 to 5n on the same stages.

Coincidence detection outputs from the respective comparators 61 to 6n are input to the priority encoder 50, and numbers 1 to n of outputs which are set at "H" level as a result of coincidence detection are encoded into binary data or the like. The resultant data is output as address information. If a plurality of data exhibit coincidence, the priority encoder 50 outputs, for example, the smallest or largest number. If no data exhibits coincidence, incoincidence detection data is set at "H" level. That is, in this embodiment, a number corresponding to a bidirectional register unit in which data is stored is output by the n comparators 61 to 6n and priority encoder 50 in accordance with the designation of the stored data content. Note that this embodiment also has a function of excluding (masking) data from comparison targets in comparing operation of each comparator.

With this arrangement, when, for example, the existence of data B3 is known and its position is to be detected, the comparator at the position corresponding to the data B3 is set at "H" level by only setting the data B3 on the data bus 60, and the address information of the location can be quickly recognized. The line decoder 30 selects one of the bidirectional register units, which is used to insert or delete data, in accordance with the obtained address information.

Assume that data E3 is to be inserted, but the existence of a group of data E is unknown. In this case, whether the data E exists can be detected first by dividing the data E3 into the data E and data 3 and excluding (masking) the portion corresponding to the data 3 from comparison targets. If it is determined as a result of this operation that the group of the data E does not exist, the data E3 may be added to the end of the data string. According to this embodiment, operation for a data string can be performed more quickly than in the first embodiment.

Figure 6:
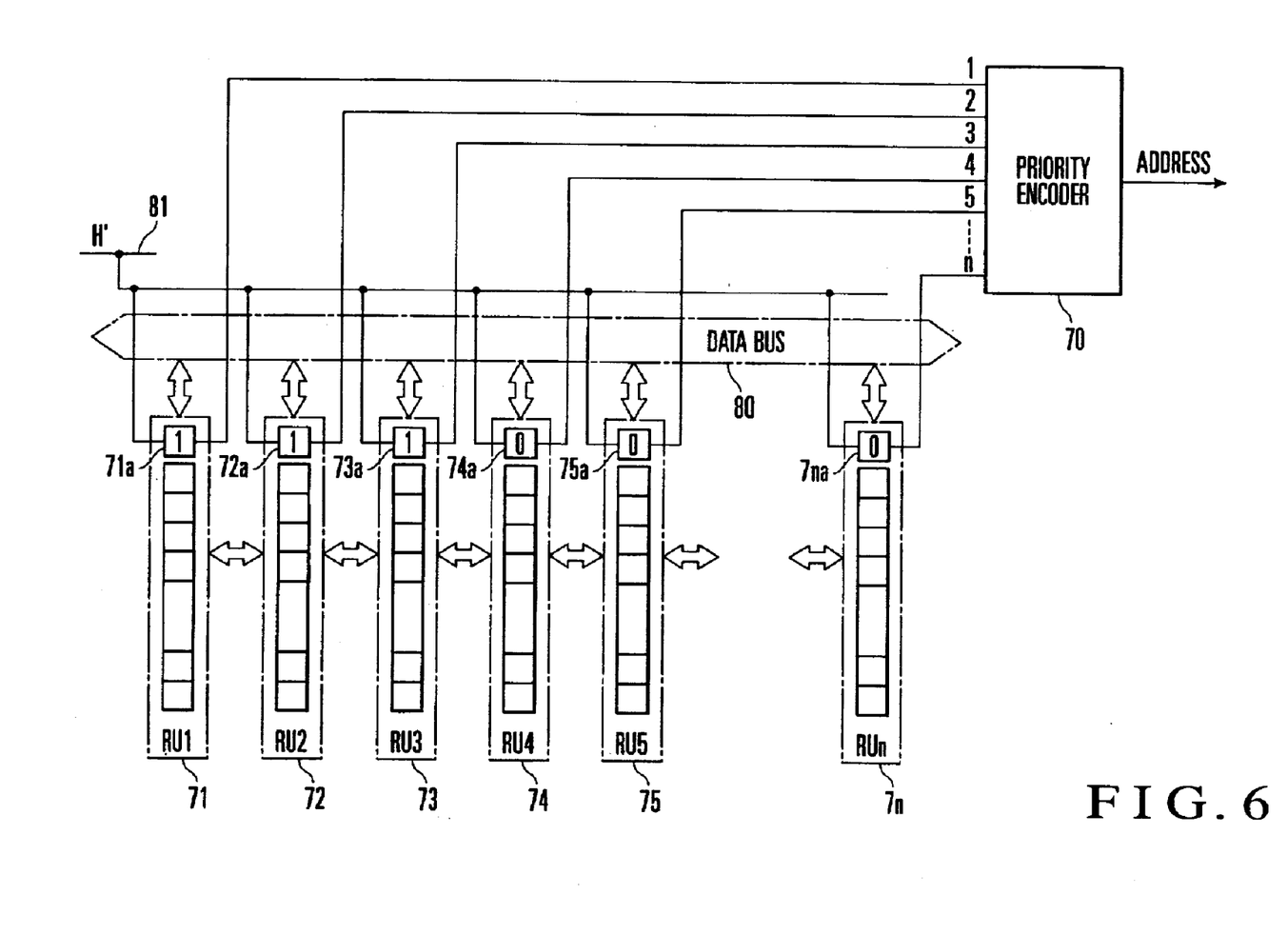
FIG. 6 is a block diagram showing a shift register according to the third embodiment of the present invention.

FIG. 6 shows a shift register according to the third embodiment of the present invention. This embodiment differs from the first embodiment in that one bit of each of bidirectional register units 71 to 7n is assigned as an end detection bit, latches 71a to 7na storing the end detection bits are connected to a pull-up signal line 81 through input/output terminals A, and the output terminals of the latches 71a to 7na are connected to input terminals 1 to n of a priority encoder 70. The latches 71a to 7na and priority encoder 70 constitute an address output means.

All the end detection bits are reset to "L" level in the initial state. When, however, data inserting operation is done on a data bus 80, the "H"-level end detection bit is set in a corresponding one of the latches 71a to 7na. Since this bit information is transferred to the next stage by shifting operation, the end detection bits in all bidirectional register units in which data are set are set at "H" level, while those in the remaining bidirectional register units are set at "L" level. Since the end detection bit is also output to the priority encoder 70, the smallest number of the "H"-level input is encoded into binary data or the like by the priority encoder 70. This data is output as address information.

In this embodiment, therefore, the 1-bit bidirectional registers assigned to the respective bidirectional register units 71 to 7n constitute a bidirectional register for inputting/outputting end detection information, and the priority encoder 70 outputs a number corresponding to the bidirectional register unit in which the end detection information is stored.

With this operation, up to which register unit data has been set (inserted) can be quickly known from address information from the priority encoder 70. This makes it possible to quickly detect the location of new data added to the end of a data string as in the second embodiment. Without a means like that in this embodiment, for example, a means for recording, on a memory or the like, information indicating up to which bidirectional register unit data has been set is required, resulting in complicated processing.

As has been described above, according to the present invention, operation with respect to a data string like inserting and deleting data with respect to the data string stored in a group of bidirectional register units can be easily and quickly implemented on hardware.

In addition, each bidirectional register unit is constituted by a plurality of bidirectional registers, and shift clocks are synchronously applied to these bidirectional registers. In addition, input/output operations through the input/output terminals of the respective bidirectional registers are synchronously done. Therefore, data can be easily and quickly inserted and deleted on a byte or word basis not only when serial data is used as a data string but also when byte data or word data is used.

In addition, since the present invention further includes the means for, when a stored data content is designated, outputting a number corresponding to the bidirectional register unit in which the data is stored, a bidirectional register unit in or from which data should be inserted or deleted can be easily and quickly detected.

Furthermore, since each bidirectional register unit further has the bidirectional register which inputs/outputs end detection information, and the present invention further includes the means for outputting a number corresponding to a bidirectional register unit in which end detection information is stored, the end of a stored data string can be easily and quickly detected. Moreover, since there is no need to have a means such as a memory on which information indicating up to which bidirectional register unit data has been stored is recoded, the arrangement of the shift register is simplified, and a reduction in cost can be achieved.

What is claimed is:

1. A shift register comprising:
   a plurality of bidirectional register units which are cascaded through first input/output terminals and which perform a data shifting operation, said bidirectional register units having second input/output terminals which separately and directly input/output data;
   direction switching means for switching shifting directions of said bidirectional register units;
   register unit selection means for selecting one of said bidirectional register units and inputting/outputting data through the second input/output terminal; and
   shift clock supply means for supplying shift clocks to said bidirectional register units ranging from a bidirectional register unit selected by said register unit selection means to a last-stage bidirectional register unit.

2. A register according to claim 1, wherein the first and second input/output terminals of said selected bidirectional register unit inputs/outputs parallel data constituted by a plurality of bits.

3. A register according to claim 1, wherein each of said bidirectional register units comprises a plurality of latch circuits arranged in parallel in correspondence with data constituted by a plurality of bits, and shift clocks from said shift clock supply means are synchronously applied to the plurality of latch circuits, and input/output operations of the latch circuits are synchronously performed through direct input/output terminals.

4. A register according to claim 1, further comprising address output means for designating a data content stored in one of said bidirectional register units to output an address indicating a bidirectional register unit corresponding to the designated data content.

5. A register according to claim 4, wherein said address output means comprises: a plurality of comparators which are respectively provided for said bidirectional register units and compare comparative data with data stored in said bidirectional register units; and an encoder which receives comparison outputs from said respective comparators and outputs an address of a bidirectional register unit having stored data identical to the comparative data.

6. A register according to claim 5, wherein said register unit selection means selects said bidirectional register unit in accordance with the address output from said encoder, and performs one of deletion and shifting operation of data stored in said selected register unit.

7. A register according to claim 1, further comprising address output means for outputting an address of said bidirectional register unit in which data is inserted last in accordance with outputting of end detection information stored in said bidirectional register unit at the time of data insertion through a direct input/output terminal.

8. A register according to claim 1, wherein said address output means comprises: a plurality of latch circuits which are respectively provided for said bidirectional register units and in which end detection information is stored in accordance with data inserting operation; and an encoder which receives latch outputs from the respective latch circuits and outputs an address of said bidirectional register unit in which data is inserted last.

* * * * *